(12) United States Patent
Fluegel et al.

(10) Patent No.: US 6,627,052 B2
(45) Date of Patent: Sep. 30, 2003

(54) ELECTROPLATING APPARATUS WITH VERTICAL ELECTRICAL CONTACT

(75) Inventors: James Edward Fluegel, Rhinebeck, NY (US); Peter Stevens Locke, Hopewell Junction, NY (US); Yuet-Ying Yu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/734,830

(22) Filed: Dec. 12, 2000

(65) Prior Publication Data

US 2002/0108862 A1 Aug. 15, 2002

(51) Int. Cl.$^7$ .............................. C25D 17/00; C25B 9/00
(52) U.S. Cl. .................................. 204/224 R; 204/279
(58) Field of Search ............................. 204/224 R, 279

(56) References Cited

U.S. PATENT DOCUMENTS

| | | | |
|---|---|---|---|
| 4,160,717 A | * | 7/1979 | Navaro et al. ............... 204/279 |
| 4,192,729 A | * | 3/1980 | Cancelleri et al. ...... 204/297.03 |
| 4,339,319 A | * | 7/1982 | Aigo ........................ 204/224 R |
| 5,000,827 A | | 3/1991 | Schuster et al. |
| 5,980,706 A | | 11/1999 | Bleck et al. |
| 6,004,440 A | | 12/1999 | Hanson et al. |
| 6,024,857 A | | 2/2000 | Reid |
| 6,027,631 A | | 2/2000 | Broadbent |
| 6,069,068 A | | 5/2000 | Rathore |
| 6,074,544 A | | 6/2000 | Reid et al. |
| 6,139,712 A | | 10/2000 | Patton et al. |

OTHER PUBLICATIONS

Eight (8) pages of data sheets (believed dated earlier than Jul. 13, 2000) for Chomerics products.
Five (5) pages of schematics for Buckled Beam, Unbuckled Beam, Contact A Series, Contact E Series and Plungers (believed dated prior to Dec. 12, 2000).
Five (5) pages (4–29, 4–30, 1–7, 5–48 and 4–71) from Sabre manuals (believed dated earlier than Nov. 21, 2000).

* cited by examiner

*Primary Examiner*—Donald R. Valentine
(74) *Attorney, Agent, or Firm*—Joseph P. Abate

(57) ABSTRACT

An electrodeposition apparatus for depositing material on a surface of a substrate. The electrodeposition apparatus includes at least one contact for vertically contacting the substrate and providing electrical connection to the substrate. The at least one contact does not scratch the surface of the substrate to be plated. A voltage source is connected to the at least one contact.

15 Claims, 5 Drawing Sheets

ELECTROPLATING APPARATUS WITH
VERTICAL ELECTRICAL CONTACT

The present invention relates to a method and apparatus for electrodepositing on a substrate. In particular, the present invention relates to a method and apparatus for electrodeposition (eg, electroplating), electroetching, and/or electropolishing in semiconductor device manufacturing.

BACKGROUND OF THE INVENTION

In the production of microelectronic devices, metal may be plated on a semiconductor for a variety of purposes. The metal may be deposited to form vias or conductive lines, such as wiring structures. Typically, metal is plated on the substrates in cells that hold a reservoir of a plating solution that includes at least one metal and/or alloy to be plated on the substrate.

Plating baths are commonly used in microelectronic device manufacture to plate at least one material, such as a metal on a substrate for a wide variety of applications. For example, plating baths may be utilized for electroplating and/or electroless plating on substrates of one or more metals and/or alloys.

The present inventors believe that contact arrangements used in a typical electroplating apparatus cause slight imperfections on the copper (Cu) seed layer during plating. These known contact arrangements have contact points located, for example, at the ends of 128 short "arms." These arms take up compression when, eg, sealing the wafer in a "clamshell" for electroplating. See, for example, known electroplating tools such as the SABRE Electro-fill System marketed by Novellus Systems, Inc, San Jose, Calif. See, also, U.S. Pat. No. 6,074,544 (Method Of Electroplating Semiconductor Wafer Using Variable Currents And Mass Transfer To Obtain Uniform Plated Layer) and U.S. Pat. No. 6,139,712 (Method Of Depositing Metal Layer), which are both incorporated in their entireties herein by reference. When a Cu seed layer is greater than 1000 A thickness, these contacts don't pose a serious problem. However, as the industry moves to thinner and thinner seed layers, these contacts do enough damage to cause large variations in plated film thickness. Having the actual contact point located at the end of a "moment arm" induces a certain, be it slight, amount of motion in the "x" direction in order to accommodate for the "z" motion required for sealing the wafer in the clamshell for electroplating. When the movement in the "x" direction occurs, it scratches across the seed layer reducing the number of good electrical connections.

SUMMARY OF THE INVENTION

The present invention provides an apparatus for depositing material, electroetching, and/or electropolishing on a surface of a substrate. The apparatus includes at least one electrical contact for contacting the substrate and providing an electrical connection to the substrate. The at least one contact is movable only in a vertical direction with respect to the substrate. A voltage source is connected to the at least one contact.

The present invention also includes a method for depositing material on a surface of a substrate. The method includes only vertically (eg, in a z direction) engaging a substrate on which a material is to be deposited with at least one electrical contact for vertically contacting the substrate and providing electrical connection to the substrate, without causing any lateral motion (eg, in an x or a y direction). A voltage source is connected to the at least one electrical contact.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Electrodeposition methods have been developed as a technique to deposit metal(s) and alloy(s) on surfaces of semiconductor substrates. Typically, for electrodeposition methods to function, reliable and practical electrical contact must be made to a substrate. Often, to help prevent deposition on side surfaces of a substrate, a region in the vicinity of the edge of the substrate is not plated.

Preventing plating of a region in the vicinity of the edge of the substrate may be accomplished by not placing a seed layer in the vicinity of the edge of the substrate. Alternatively, a structure may be placed over the edge of the substrate to prevent deposition of metals in the vicinity. Where edge exclusion is carried out, typically, about 2 to about 5 mm of the edge may be excluded. Typically, the primary penalty for not plating or not being able to plate in the vicinity of the edge of a semiconductor substrate is decrease in the chip yield from a wafer and a loss of flexibility of chip layout.

According to one example, that of chip interconnection wiring applications, a seed layer may be deposited on a structure prior to electrodeposition. For example, in the case of copper interconnection wiring structures, a thin copper seed layer may be deposited on the surface. The seed layer may not be deposited in the vicinity of the edge of the substrate to avoid the side surface plating problem. However, to make reliable contact to a substrate to help ensure uniform plating, electrical contact typically is made about 3 mm into the seed layer.

Figure 1:
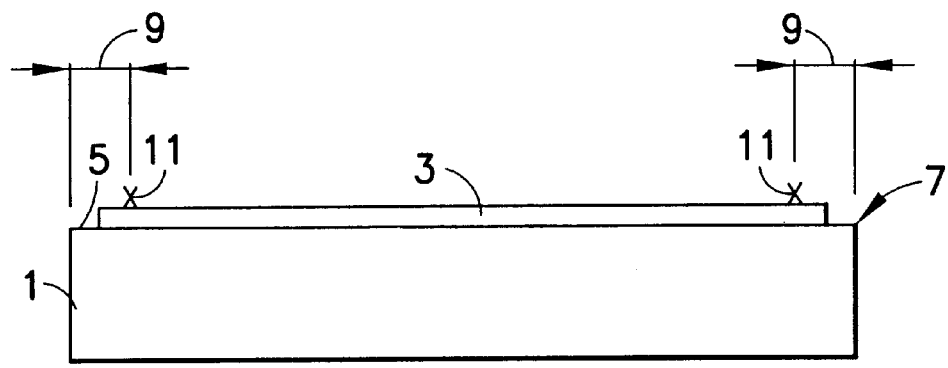
FIG. 1 represents a cross-sectional view of a typical semiconductor substrate showing regions normally plated in a known electrodeposition apparatus.

FIG. 1 illustrates a typical arrangement of a semiconductor substrate and a plating apparatus. Accordingly, FIG. 1 illustrates a semiconductor substrate 1, such as a wafer. A seed layer 3 is formed on the upper surface 5 of the substrate 1. As FIG. 1 illustrates, the seed layer does not extend all the way to the edge 7 of the substrate 1. Rather, an exclusion zone 9 about 1 to about 5 mm is not plated. Contact to the seed layer 3 on the substrate 1 is made by the contacts 11 arranged on the surface of the substrate. To help ensure good connection to the seed layer 3, typically, as illustrated in FIG. 1, the contacts 11 are arranged well into the seed layer 3.

Figure 2:
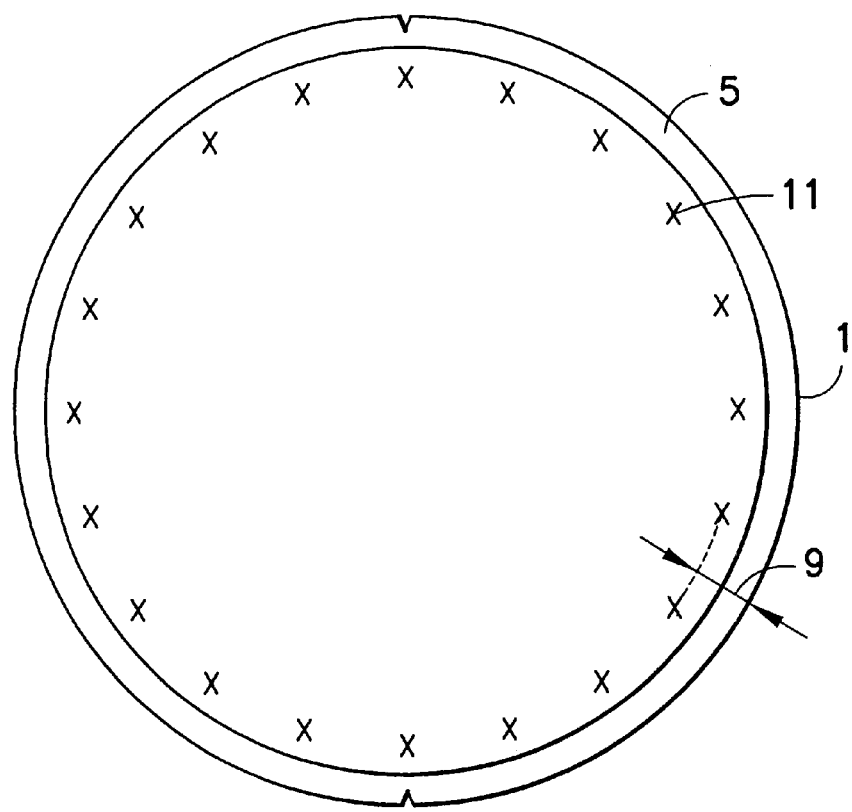
FIG. 2 represents a top plan view of a semiconductor wafer illustrating the typical relative location of electrical contacts according to a known electrodeposition apparatus.

FIG. 2 illustrates an overhead of the substrate 1 illustrated in FIG. 1. As seen in FIG. 2, the contacts 11 may be arranged about the substrate 1.

The number of contacts may vary depending upon the application. For example, the number of contacts may depend upon the size of the wafer. It may also depend upon the plating operation being carried out. For example, on a semiconductor substrate having a diameter of about 200 mm, if the electrodeposition operation is part of a C4 process, with a thick seed layer, as few as four contacts may be used. On the other hand, if the seed layer is thin, such as about 300 Å to about 500 Å, the number of contacts typically needs to be greater. A thin seed layer may require in excess of about 50 contacts. Also, for plating on substrates larger than about 200 mm in diameter, the number of contacts may need to exceed about 400.

The present inventors believe that known contact arrangements cause slight imperfections on the copper (Cu) seed layer during plating. These known contact arrangements have contact points located at the ends of, eg, 128 short "arms." These arms take up compression when, eg, sealing the wafer in a "clamshell" for electroplating. See, for example, known electroplating tools such as the SABRE Electro-fill System marketed by Novellus Systems, Inc, San Jose, Calif. See, also, previously incorporated U.S. Pat. Nos. 6,074,544 and 6,139,712. When the Cu seed layer is greater than 1000 A thickness, this doesn't pose a problem. However, as the industry moves to thinner and thinner seed layers, these contacts do enough damage to cause large variations in plated film thickness. Having the actual contact point located at the end of a "moment arm" induces a certain, be it slight, amount of motion in the "x" direction in order to accommodate for the "z" motion required for sealing the wafer in the clamshell for electroplating. When the movement in the "x" direction occurs, it scratches across the seed layer reducing the number of good electrical connections.

To solve this scratching problem, the present invention provides an electroplating apparatus including a PVDF plastic ring provided with a quantity (eg, 128) of counterbored holes. The holes hold the contact pins (manufactured from, for example, stainless steel or any corrosion resistant conductive alloy). These pins could then be backed with corrosion resistant, conductive rubber which is commercially available (eg, an electrically conductive elastomer marketed by Chromerics, Inc., Woburn, Mass.) and would serve two purposes—#1 Tie all 128 pins to a common connection—#2 Provide enough flexibility in the connection to avoid damaging the wafer/seed layer. The pins are fixed (eg, press fitted) into the ring so that the pins are movable with the contact carrier in only a vertical (eg, z) direction. See FIG. 4, FIGS. 5A and 5B. A preferred contact pin is shown in FIG. 6.

A second, simpler and easier to implement arrangement eliminates the pin contact totally and simply use the conductive rubber to contact directly to the wafer during plating.

Figure 3:
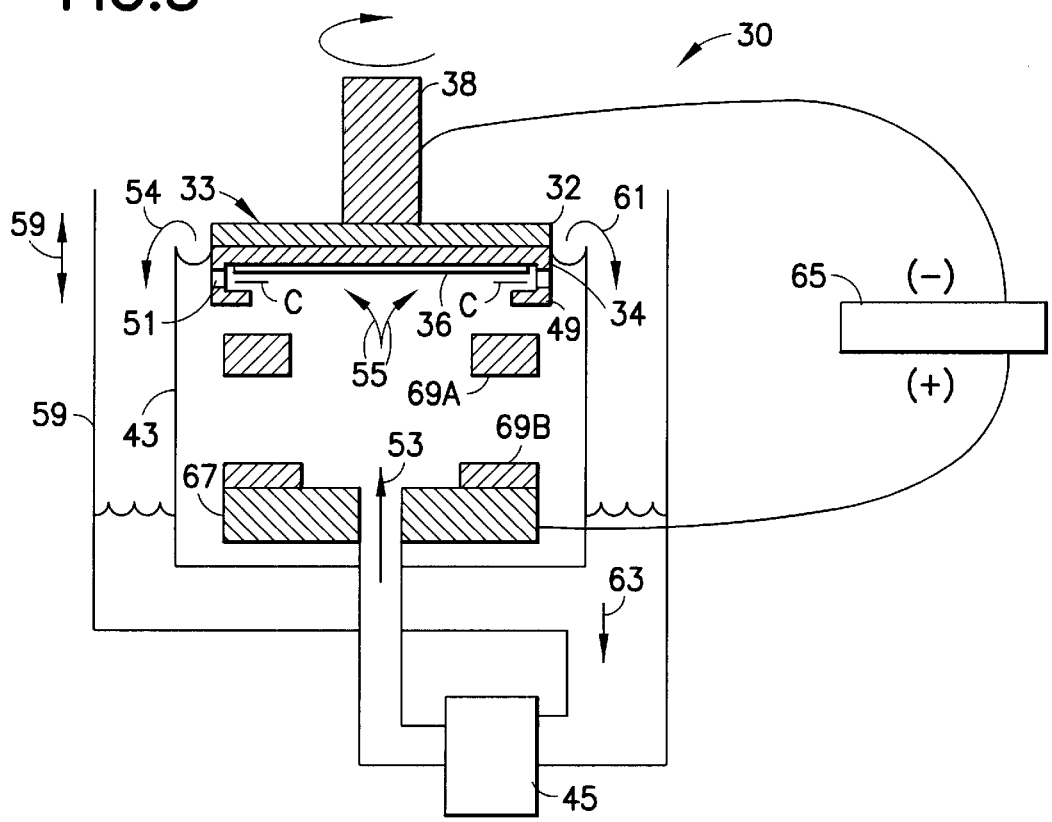
FIG. 3 represents a block schematic cross-sectional view of an electroplating apparatus including vertical electrical contacts according to the present invention.
Figure 4:
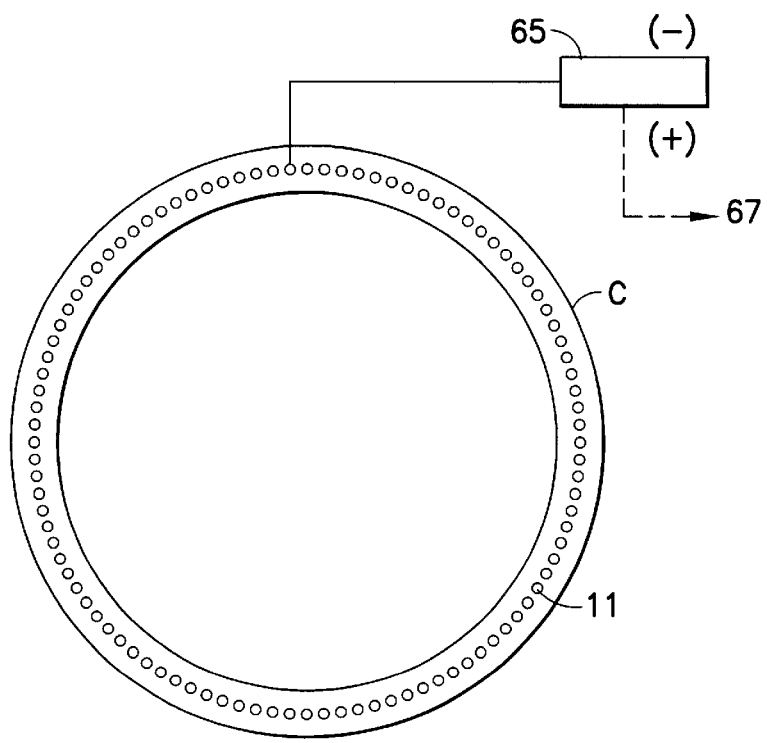
FIG. 4 is a schematic top plan view of a contact carrier C in which a plurality of continuous contacts (eg, contact pins) are fixed according to the present invention.
Figure 5A:
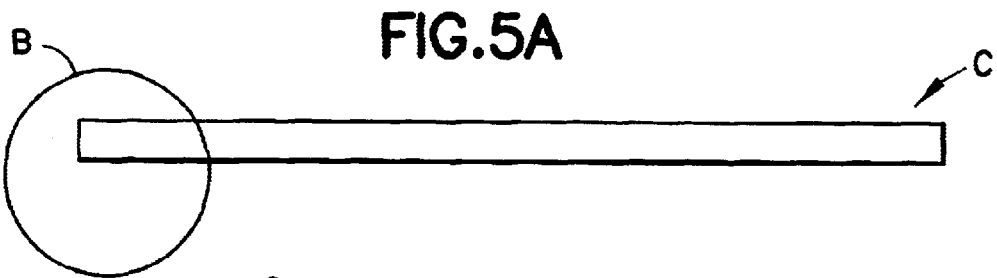
FIG. 5A is a side schematic view of the contact carrier C shown in FIG. 4.

FIG. 3 is a diagrammatical view of an electroplating apparatus 30 having a wafer 36 mounted therein, and a vertically movable contact carrier C with fixed electrical contacts (eg, contact pins) in accordance with the present invention—see, eg, FIG. 4. Apparatus 30 includes a clamshell 33 mounted on a rotatable spindle 38 which allows rotation of clamshell 33. Clamshell 33 comprises a cone 32, a cup 34 and a flange 49. Flange 49 has formed therein a plurality of apertures 51. Except for the contact carrier C with fixed pins, the apparatus 30 may be an apparatus as described in U.S. Pat. Nos. 6,139,712 (Method of Depositing Metal Layer) and 6,074,544 (Method Of Electroplating Semiconductor Wafer Using Variable Currents And Mass Transfer To Obtain Uniform Plated Layer), previously incorporated by reference.

During the electroplating cycle, wafer 36 is mounted in cup 34. Clamshell 33 and hence wafer 36 are then placed in a plating bath 43 containing a plating solution. As indicated by arrow 53, the plating solution is continually provided to plating bath 43 by a pump 45. Generally, the plating solution flows upwards to the center of wafer 36 and then radially outward and across wafer 36 through apertures 51 as indicated by arrows 55. Of importance, by directing the plating solution towards the center of wafer 36, any gas bubbles entrapped on wafer 36 are quickly removed through apertures 51. Gas bubble removal is further enhanced by rotating clamshell 33 and hence wafer 36.

The plating solution then overflows plating bath 43 to an overflow reservoir 59 as indicated by arrows 61. The plating solution is then filtered (not shown) and returned to pump 45 as indicated by arrow 63 completing the recirculation of the plating solution.

A DC power supply 65 has a negative output lead electrically connected to wafer 36 through one or more slip rings, brushes and contacts (not shown). The positive output lead of power supply 65 is electrically connected to an anode 67 located in plating bath 43. During use, power supply 65 biases wafer 36 to have a negative potential relative to anode 67 causing an electrical current to flow from anode 67 to wafer 36. (As used herein, electrical current flows in the same direction as the net positive ion flux and opposite the net electron flux.) This causes an electrochemical reaction (eg, $Cu^{++}+2e^{-}=Cu$) on wafer 36 which results in the deposition of the electrically conductive layer (eg, copper) on wafer 36. The ion concentration of the plating solution is replenished during the plating cycle, for example by dissolving a metallic anode (eg, $Cu=Cu^{++}+2e^{-}$). Shields 69A and 69B (virtual anodes) are provided to shape the electric field between anode 67 and wafer 36.

The operation of the apparatus 30 is controlled by, for example, a microprocessor connected to a memory having suitable operational data and instructions stored therein (all not shown).

Alternatively, a single contact (eg, an electrically conductive elastomer) could continuously engage a substrate about its perimeter. According to the present invention, a plurality of contacts could be arranged around the substrate. The plurality of contacts could all be separate structures. Such contacts may considered to be discontinuous.

Figure 5B:
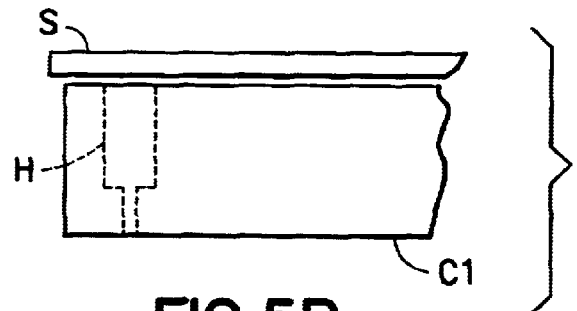
FIG. 5B is a side schematic enlarged view of the circled area of FIG. 5A, showing a hole H for a fixed (eg, press fitted) electrical contact, and also showing a compliant seal material disposed at a side of the carrier opposite a side Cl which faces the wafer 36 during normal operation of the apparatus 30 of FIG. 3.
Figure 6:
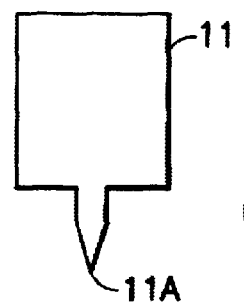
FIG. 6 is a side schematic view of one preferred embodiment for a contact pin 11 of FIG. 4.

As can be seen in FIG. 5B, press fitted pin contacts according to the present invention can provide electrical contact to a substrate without damaging any of the upper surface of the substrate where material is to be electrode-posited.

Figure 7A:
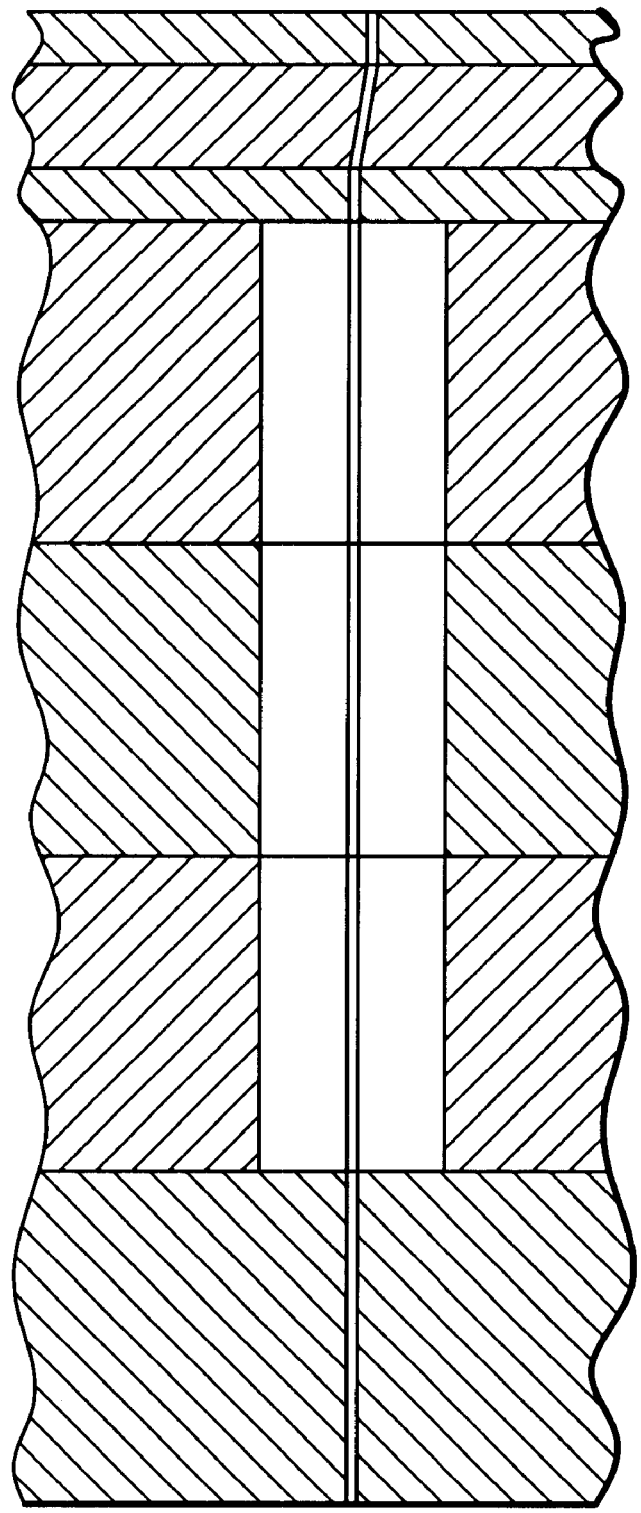
FIG. 7A is a side schematic view of another preferred embodiment for a contact pin which can be employed in the present invention.
Figure 7B:
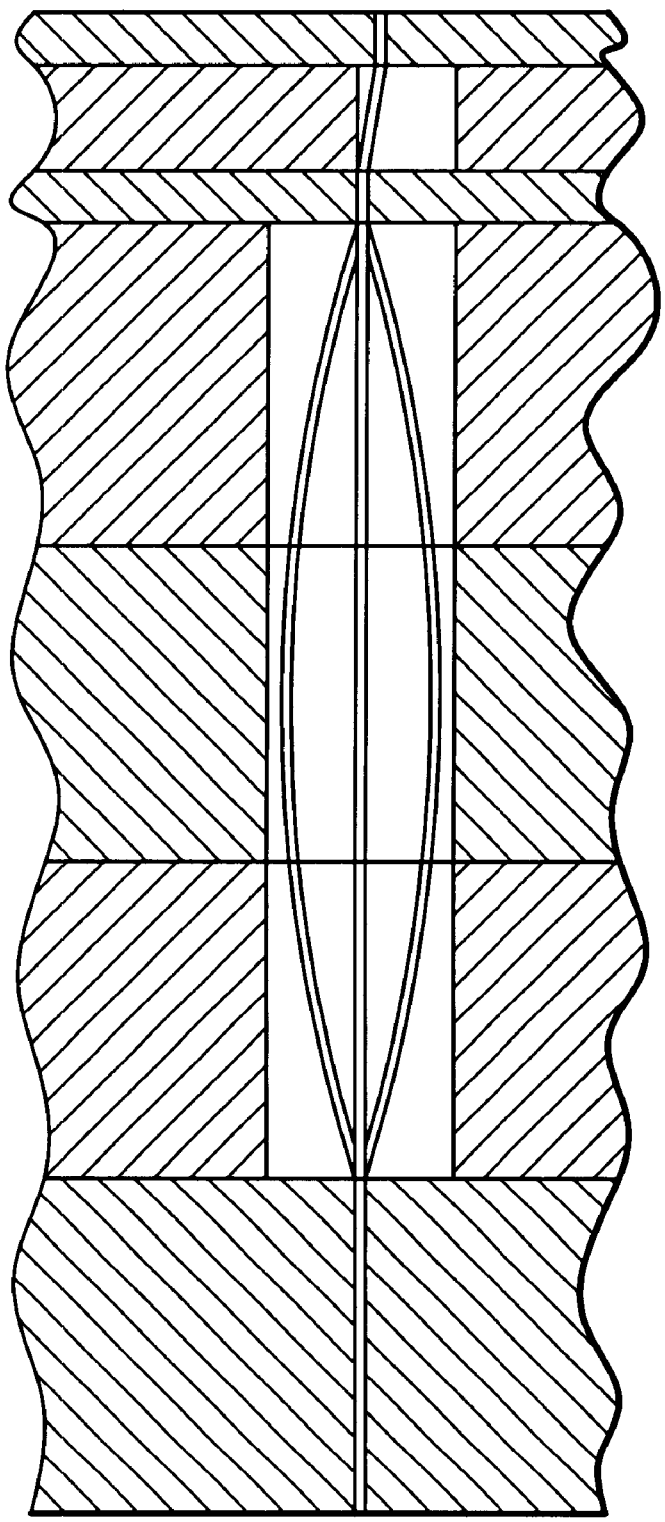
FIG. 7B is a side schematic view of the pin of FIG. 7A, in a buckled state.

The shape of a contact according to the present invention may vary, depending upon the embodiment, but must make either single point contact (eg, pin 11, 11A) or continuous contact (eg, conductive elastomer). FIGS. 6, 7A and 7B illustrate various examples of embodiments of contacts according to the present invention. In the case of the straight pins or "unbuckled beam," (FIG. 7A), they could be backed with corrosion resistant conductive rubber to take up the compression of the clamshell and to tie all 128 pins to a common connection. In the case of the "buckled beam", (FIG. 7B), all pins should be wired together (shorted) before effecting the connection to the negative output lead of the DC power supply 65.

Figure 5C:
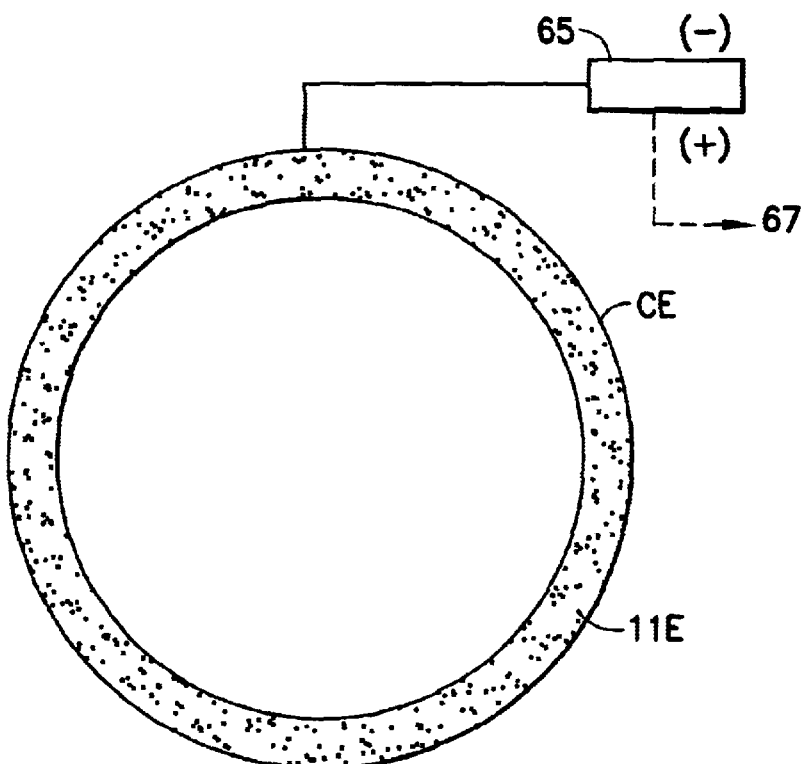
FIG. 5C is a schematic top plan view of a contact carrier comprising a conductive elastomer.

The embodiment illustrated as FIG. 4 makes contact at single points where the contacts touch the seed layer. On the other hand, the conductive elastomer CE embodiment illustrated in FIG. 5C may make contact all along its length with the seed layer and the substrate. The conductive elastomer CE having conductive filler 11E is, eg, a CHO-SEAL conductive elastomer marketed by Chromerics, Inc., Woburn, Mass.

In addition to varying the number, arrangement, and shape of the contacts, the structure of the contacts may also vary. Along these lines, the composition of the contacts may vary. According to some embodiments, the contacts may be made of copper. According to other embodiments, the contacts may be made of stainless steel. The contact or contacts may also be made of other materials. Along these lines, the contact(s) may also include a mixture of copper and beryllium.

Additionally, portions of the contacts may be made of other materials. For example, the entire contact or just a portion of the contact that contacts the substrate and/or seed layer may be coated with another material. For example, the contact or portion of the contacts that engage the seed layer and/or substrate may have a coating of $\alpha$-Ta, nitrides of tantalum, gold, rhodium, and/or titanium nitride with Ti overlay, in other words, TiN/Ti. Examples of nitrides of tantalum include hexagonal-TaN and cubic-TaN.

Regardless of the composition of the contacts, they may be coated with another material. For example, the contacts may be coated with an elastomeric coating, such as VITON, or polymers, such as PTFE or PVDF (polyvinylidene fluoride) and their like. The U polymer coating may be deposited on the contacts in order to prevent wasteful metal deposition in this region.

Whether a contact is made of copper, stainless steel, or any other electrically conductive material(s), such contacts could be coated with $\alpha$-Ta, nitrides of tantalum, gold, rhodium, and/or titanium nitride with Ti overlay, an elastomeric or non-elastomeric polymer coating, and/or any other material.

The backside of the substrate, that side of the substrate that does not include the seed layer, may be sealed by a seal (not shown). The seal could also be an O-ring type of seal. The seal, wafer, and spring may be clamped into position by a clamp. The seal may be utilized to help prevent electrolytes from coming into contact with the backside of the substrate.

The present invention includes a plating apparatus. A plating apparatus according to the present invention includes at least one contact such as those described above. FIG. 3 illustrates an embodiment of a plating apparatus according to the present invention including one embodiment of contacts according to the present invention.

The present invention also includes a method for depositing material on a surface of a substrate. The method includes engaging the substrate on which material is to be deposited with at least one contact movable only in the vertical direction. The at least one contact vertically contacts the substrate and provides an electrical connection to the substrate without obscuring the surface of the substrate to be plated. A voltage source may be connected to the at least one contact. The contacts and plating apparatus may be provided substantially as described above. The at least one contact may be biased into contact with the substrate.

As stated above, the material being deposited may be deposited over the entire surface of the substrate that it is desired the material be deposited. This is at least in part due to the fact that the contacts according to the present invention obscure the surface of the substrate on which material is being deposited. The at least one contact may be retracted. A corner of the substrate may also be engaged by the at least one contact. Also, the contact may be used to electroetch or electropolish metals on a substrate. In this case, the contacts are rendered anodic.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An apparatus for depositing material on a surface of a substrate, comprising:
   at least one electrical contact movable only in a vertical direction for engagement with said surface of said substrate, and
   a voltage source connected to said at least one electrical contact, wherein said at least one electrical contact is a buckled beam contact.

2. An apparatus for depositing material on a surface of a substrate, comprising:
   at least one electrical contact movable only in a vertical direction for engagement with the surface of said substrate, and
   a voltage source connected to said at least one electrical contact, wherein said at least one electrical contact comprises an electrically conductive elastomer.

3. An apparatus for depositing material on a surface of a substrate, comprising:

at least one electrical contact movable only in a vertical direction for engagement with the surface of said substrate, and a voltage source connected to said at least one electrical contact, wherein said at least one electrical contact is an unbuckled beam contact.

4. An apparatus for depositing material on a surface of a substrate, comprising:

at least one electrical contact movable only in a vertical direction with respect to the surface of the substrate;

means for connecting the contact to a voltage source; and a contact carrier in which the contact is fixed, said contact carrier consisting essentially of a plastic;

wherein the at least one electrical contact is a buckled beam contact.

5. The apparatus as claimed in claim 4, wherein the plastic is polyvinylidene fluoride.

6. The apparatus as claimed in claim 5, wherein the contact comprises copper.

7. The apparatus as claimed in claim 6, wherein the contact further comprises α-Ta.

8. An apparatus for depositing material on a surface of a substrate, comprising:

at least one electrical contact movable only in a vertical direction with respect to the surface of the substrate;

means for connecting the contact to a voltage source; and a contact carrier in which the contact is fixed, said contact carrier consisting essentially of a plastic;

wherein the at least one electrical contact is an unbuckled beam contact.

9. The apparatus as claimed in claim 8, wherein the plastic is polyvinylidene fluoride.

10. The apparatus as claimed in claim 9, wherein the contact comprises copper.

11. The apparatus as claimed in claim 10, wherein the contact further comprises α-Ta.

12. An apparatus for depositing material on a surface of a substrate, comprising:

at least one electrical contact movable only in a vertical direction with respect to the surface of the substrate;

means for connecting the contact to a voltage source; and a contact carrier in which the contact is fixed, said contact carrier consisting essentially of a plastic;

wherein the at least one electrical contact comprises an electrically conductive elastomer.

13. The apparatus as claimed in claim 12, wherein the plastic is polyvinylidene fluoride.

14. The apparatus as claimed in claim 13, wherein the contact comprises copper.

15. The apparatus as claimed in claim 14, wherein the contact further comprises α-Ta.

* * * * *